US006930834B2

(12) United States Patent
Ogusu et al.

(10) Patent No.: US 6,930,834 B2
(45) Date of Patent: Aug. 16, 2005

(54) METHOD OF MANUFACTURING DIFFRACTIVE OPTICAL ELEMENT

(75) Inventors: Makoto Ogusu, Ishibashimachi (JP); Yuichi Iwasaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 89 days.

(21) Appl. No.: 10/023,689

(22) Filed: Dec. 21, 2001

(65) Prior Publication Data

US 2002/0122255 A1 Sep. 5, 2002

(30) Foreign Application Priority Data

Dec. 22, 2000 (JP) ....................................... 2000-389978

(51) Int. Cl.[7] .................................................. G02B 5/18

(52) U.S. Cl. ........................................ 359/571; 430/321

(58) Field of Search ................................ 359/566, 558, 359/569, 571; 216/24; 430/5, 320, 321, 322, 323, 324; 427/162, 164, 165, 166

(56) References Cited

U.S. PATENT DOCUMENTS 5,004,673 A * 4/1991 Vlannes ....................... 430/325
6,475,704 B1 * 11/2002 Iwasaki et al. ............. 430/321
6,534,221 B2 * 3/2003 Lee et al. ....................... 430/5
6,613,498 B1 * 9/2003 Brown et al. ............... 430/322

FOREIGN PATENT DOCUMENTS

| | | |
|---|---|---|
| JP | 61-27505 | 2/1986 |
| JP | 63-168601 | 7/1988 |
| JP | 5-224398 | 9/1993 |

OTHER PUBLICATIONS

Y. Suzuki et al., "Gas Plasma Etching of Chromium Films," 21(9) *Jap. J. Appl. Phys.* 1328–1332 (1982).

F.H.M. Sanders et al., "Selective Isotropic Dry Etching of $Si_3N_4$ Over $SiO_2$," 129(11) *J. Electrochem. Soc.* 2559–2561 (1982).

* cited by examiner

*Primary Examiner*—Thong Nguyen
*Assistant Examiner*—Arnel C. Lavarias
(74) *Attorney, Agent, or Firm*—Fitzpatrick, Cella, Harper & Scinto

(57) ABSTRACT

A method of manufacturing a diffractive optical element, including a process for forming a resist mask of blazed shape upon a substrate and for etching the substrate by use of the resist mask so that the blazed shape is transferred to the substrate. The method includes a process for forming, before the etching, an element being effective to prevent a taper shape, to be produced at an edge of the blazed shape of the resist mask, from being transformed to the substrate.

9 Claims, 11 Drawing Sheets

METHOD OF MANUFACTURING DIFFRACTIVE OPTICAL ELEMENT

FIELD OF THE INVENTION AND RELATED ART

This invention relates generally to a method of manufacturing a diffractive optical element. In other aspect, the invention concerns a mold for production of a diffractive optical element which mold is produced in accordance with the diffractive optical element manufacturing method, a diffractive optical element, an optical system having such diffractive optical element, an optical instrument, an exposure apparatus, a device manufacturing method, or a device itself. More particularly, the invention concerns a method of manufacturing a diffractive optical element or the like having a section of blazed shape.

Conventionally, the following methods are known as a method of manufacturing a diffractive optical element having a section of blazed shape (saw-toothed shape).

(a) Japanese Laid-Open Patent Application, Laid-Open No. 224398/1993 shows a method using a transmission factor control type mask, in which the transmission factor of light is made variable with the structure that aggregations of opening portions and light blocking portions being alternately disposed with a small spacing which is unresolvable by mask exposure, are formed on a substrate by optical exposure technology, with a resolvable spacing. By a single exposure using this mask, a resist pattern is formed into a desired blazed shape, and the thus formed resist pattern in used as a diffractive element.

(b) Japanese Laid-Open Patent Application, Laid-Open No. 27505/1986 shows a method in which an electron beam is projected onto a substrate, for providing a diffractive optical element, to shape a resist into a blazed shape and, after that, the resist and the substrate are etched by reactive ion etching, for example, such that a diffraction element having a desired blazed shape is produced (c) Japanese Laid-Open Patent Application, Laid-Open No. 168601/1988 shows a method in which an etching stopper layer having a periodic protrusion shape is formed on a substrate by a photolithographic process and, after that, polyimide is applied to fill the interspace of the etching stopper layer. Subsequently, etching-back is carried out to the level of the etching stopper layer. After this, ion milling is performed in an oblique direction to produce a blazed shape. A reflection layer is formed thereon, to provide a reflection type diffraction grating.

As described above, a diffractive optical element with a section of blazed shape or a mold therefor is manufactured by using lithographic technology including exposure and etching processes, which are used in the semiconductor production. If there occurs no error in the resist pattern shape, being patterned, an idealistic blazed shape can be produced.

For example, a diffraction grating, that is, a blazed grating, constituted by grooves having a saw-tooth sectional shape as described above, has a feature that, when the sectional shape is a saw-tooth shape that satisfies a blaze condition, light is concentrated to diffraction light of a particular order as determined by the blaze condition and, therefore, it can diffract light efficiently to a particular direction. For this reason, it is very useful in a spectroscope, an optical information processing unit, or an optical system, for example.

The blaze condition can be expressed by the following equation, when the tilt (blazed angle) of the saw-tooth shape grooves shown in FIG. 5 is θ, the period of the grooves is W, the wavelength of incident light is λ and the refractive index of the diffractive optical element is n:

$$\tan\theta=\lambda/\{Wx[n-1]\}$$

Further, as described above, since the diffractive optical element exercises its optical performance in dependence upon the blazed shape formed on a substrate, the optical performance thereof, particularly, the diffraction efficiency is largely influenced by the formed blazed shape, that is, the sectional shape.

However, conventional methods such as described above involved the following inconveniences.

In the simultaneous exposure process of method (a) using a variable transmission factor mask, it is difficult to precisely produce the shape of the slant of the blaze and the phase discontinuous portion, by using a resist pattern. Where the grating pitch is relatively large as conventional, the error might be disregarded. However, if the grating pitch is fine, it can not be disregarded.

Further, in the diffractive element produced in accordance with method (a) a resist is used as the diffractive element. Therefore, it is soft and the durability is bad. Where it is used as a transmission type diffractive element, since the transmission factor of the resist which is an organic material is low with respect to light of a wavelength shorter than visible light, the practicability in small. More specifically, FIGS. 13A–13C are sectional views for explaining process for manufacturing a blazed shape diffractive element in accordance with the method (a). At the step of FIG. 13A, a resist film 81 is formed on a substrate 80. At step of 13B, the substrate is loaded into an exposure apparatus, and the resist 81 is exposed to exposure light 83, while the exposure amount by the exposure light 83 is changed periodically by using a transmission factor control type 82. Where a positive type resist is used, exposed regions become solvable to developing liquid. Thus, as shown in FIG. 13C, a resist pattern 84 of a desired blazed shape is formed by developing treatment. As a result a substrate 80 having a desired blazed shape formed on its surface is produced.

As described above, since the diffractive element manufactured by this method uses the resist as the diffractive element, it is soft and the durability is bad. When it is used as a transmission type diffractive element, since the transmission factor of the resist which is an organic material is low with respect to light of a wavelength shorter than visible light, the practicability is low.

In the electron beam patterning process according to method (b) described above, when a resist pattern of blazed shape is produced, an error in shape of the resist pattern with respect to an idealistic shape becomes generally small, whereas, since the amount of pattern drawing is huge, a sufficient throughput is not attainable for the production. This leads to a problem that, if the device size becomes large, the work time becomes extraordinarily too long.

In accordance with method (c), in the formation of the slant of the blazed shape, the slant is formed simultaneously by the ion milling. Therefore, blazing is attainable in the case of a regular-period diffractive element which requires an even blaze angle over the whole diffractive element, whereas blazing is very difficult in the case of an irregular-period diffractive element which has both of diffraction function and condensing function since optimum blaze angle is different for the grooves, respectively. Further, in accordance with this method, a large-size etching apparatus is necessary, but also, etching of a large area is difficult to accomplish. Therefore, only a small area substrate can be processed. Also, even when plural diffraction gratings are produced simultaneously, the efficiency is low. Additionally, with this method, for those other than an even pitch, the manufacture is very difficult Therefore, the applicability of elements produced thereby is very narrow.

Further, in the manufacture of a diffractive optical element or the like in which a blazed shape resist pattern itself is used or a resist pattern is used as a transfer mask, such as described above, an error due to the resist pattern causes extraordinarily large degradation of the optical performance the diffractive optical element, particularly, the diffraction efficiency. It in impossible to remove the error of the resist pattern shape completely. For example, where a transmission factor control type mask is used with optical exposure technology, under the condition that the exposure wavelength is 248 nm, numerical aperture of a projection system in 0.60, the resist is SAL601 (430 nmt) and a transmission factor control type mask of 11-level is used, it is very difficult to produce an idealistic shape of a resist pattern, that is, blazed shape or right triangle, an seen from a calculation example shown in FIG. 14. Further, such error causes an increase of cost because, once produced, correction is impossible.

As described above, it is impossible to completely avoid an error in the shape of a resist pattern. As a result, an idealistic shape such as shown in FIG. 12A and a shape different from the idealistic shape, that is, an incorrect shape such an shown in FIG. 12B, are produced. The optical performance such as diffraction efficiency, for example, is degraded largely thereby.

The inventors of the subject application have made the following investigations in relation to production of a blazed shape, while defining an error (x) which concerns tilt of the vertical portion, such as shown in the FIG. 12B, and an error (y) concerning a discontinuous surface where the blazed surface is spatially interrupted.

Now, a case is considered as an example, wherein $SiO_2$ is used as a substrate, the period W is 2.80 micron, the depth is 427 nm, and the used wavelength is 248 nm. Where an idealistic blazed shape such as shown in FIG. 12A is produced, the diffraction efficiency according to the RCWT (Rigorous Coupled Wave Theory) theory, including the loss due to reflection, is 88.57%. On the other hand, where a deviation in incorrect shape (FIG. 12B) from the ideal shape (FIG. 12A) is expressed by x and y, and when x=y=200 nm, the diffraction efficiency with reflection being taken into account is 78.05%. This corresponds to a decrease of 10.52%. According to actual measurements and simulations made by the inventors, similar results were obtained.

In the case of FIG. 14, the shape error amount is x=160 nm and y=315 nm. It is estimated that, if this error is directly transferred and reproduced in a diffraction pattern, the diffraction efficiency is 80% or less. Further, as regards the influence of the shape error x and y to diffraction efficiency, if x=200 nm and y=0 nm, the theoretical diffraction efficiency including the loss due to reflection is 81.95%. Similarly, if x=0 nm and y=200 nm, the theoretical diffraction efficiency including the loss due to reflection is 87.50%. Thus, even for the same error amount, there is a difference of 5.55% in the theoretical diffraction efficiency. Table 1 below shows theoretical diffraction efficiencies in cases where the shape error amount x and y changes from 0 to 250 nm.

TABLE 1

CHANGES IN DIFFRACTION EFFICIENCY DUE TO ERROR IN BLAZED SHAPE

| Error (nm) | | x: 0 | 100 | 150 | 200 | 250 |
|---|---|---|---|---|---|---|
| y | 0 | 88.57 | 86.76 | 84.68 | 81.95 | 78.72 |
| | 100 | 88.26 | 85.70 | 83.24 | 80.14 | 76.56 |
| | 150 | 87.93 | 85.05 | 82.42 | 79.15 | 75.39 |
| | 200 | 87.50 | 84.31 | 81.51 | 78.05 | 74.11 |
| | 150 | 86.97 | 83.46 | 80.46 | 76.80 | 72.69 |

Thus, it is seen that, in a diffractive optical element having a blazed shapes, the influence to the optical performance, particularly, the diffraction efficiency, is largely attributable to the shape error x, that is, the shape error in the vertical the blazed shape.

SUMMARY OF THE INVENTION

It Is an object of the present invention to provide a method of manufacturing a diffractive optical element by which an error in shape can be reduced effectively.

It is another object of the present invention to provide a mold for manufacture of a diffractive optical element which mold is produced in accordance with the diffractive optical element manufacturing method, a diffractive optical element, an optical system having such diffractive optical element, an optical instrument having such diffractive optical element, an exposure apparatus having such diffractive optical element, a device manufacturing method using a diffractive optical element, or a device produced by using a diffractive optical element.

In accordance with the present invention, there is provided at least one of a diffractive optical element manufacturing method, a diffractive optical element manufacturing mold being produced in accordance with a diffractive optical element manufacturing method, a diffractive optical element, an optical system having a diffractive optical element, an optical instrument, an exposure apparatus, a device manufacturing method and a device, having features (1) –(37) below.

(1) A method of manufacturing a diffractive optical element, including a process for forming a resist mask of blazed shape upon a substrate and for etching mask of blazed shape upon a substrate and for the blazed shape in transferred to the substrate, characterized by a process for forming, before the etching, means effective to prevent a taper shape, to be produce at an edge of the blazed shape of the resist mask, from being transferred to the substrate.

(2) A method of manufacturing a diffractive optical element, including a process for forming a resist mask of blazed shape upon a substrate and for etching the substrate by use of the resist mask so that the blazed shape is transferred to the substrate, characterized by a process for forming, before the etching, a mask or non-blazed shape at a position corresponding to an edge of the blazed shape of the resist mask.

(3) A method of manufacturing a diffractive optical element, including a process for forming a resist mask of blazed shape upon a substrate and for etching the substrate by use of the resist mask so that the blazed shape is transferred to the substrate characterized by a process for forming, before the etching, a protrusion at a position corresponding to an edge of the blazed shape of the resist mask.

(4) A method of manufacturing a diffractive optical element by transferring a mask pattern to a workpiece, characterized in that a shape of a vertical portion of the diffractive optical element is defined by use of a first mask and that a shape of a slant portion of the diffractive optical element is defined by a second mask and in a processing region determined by the first mask.

(5) in items (4) and (5), the shape of the vertical portion of the diffractive optical element may be defined by transferred an edge portion of the first mask.

(6) In item (5), the processing region may be a region determined by transferring the edge portion of the first mask.

(7) In item (4), the first mask may be made of first and second materials, wherein, after a processing region determined by the first material is processed, the processing region may be covered by the second material and, subsequently, the first material may be removed and, while using that portion as a processing region, the processing region determined by the first material may be replaced by the second material to cause inversion of processing region.

(8) In item (7), each of the first and second materials may consist of at least one of metal, oxide and nitride.

(9) In item (8), one of the first and second materials may comprise a chromium oxide film, and the other may comprise an aluminum film.

(10) In item (8), one of the first and second materials may comprise a dual-layer film having a chromium oxide film and a chromium film, and the other material comprises an aluminum film (11)In item (9) or (10), a silicon nitride may be used in place of the materials as aforesaid.

(12) In items (7)–(11), the inversion of processing region may be based on one of etch-back method, lift-off method, damascene method, and selective deposition method.

(13) In items (4)–(6), the first mask may be made of first and second materials, wherein the first material comprises a light blocking material and the second material may comprise a negative resist, wherein light may be transmitted through the workpiece made of a light transmitting material, from behind it, thereby to cause sensitization (reaction) of the negative resist, wherein a processing region determined by the first material may be covered by a negative resist and, thereafter, hard baking is carried out, and wherein the first material may be removed to cause inversion of processing region.

(14) In item (13), the first material of the first mask may comprise a metal film.

(15) In item (14), the metal film may be one of a chromium film and an aluminum film.

(16) In items (4)–(15), the second mask may comprise a resist.

(17) In item (16), the shape of the second mask may be defined on the basis of control of exposure amount.

(18) In item (17), the shape of the second mask based on the exposure amount control may be determined by (i) forming the first mask by use of a material being non-transparent with respect to exposure light and forming the second mask by use of a negative resist, and (ii) tilting incident rays of exposure light when the exposure light is incident from behind the workpiece being made of light transmitting material, where the surface thereof being coated with a resist is a front face.

(19) In item (18), a structure for preventing reflection may be added to the resist surface.

(20) In item (19), a member having a structure for the reflection prevention may comprise a glass plate.

(21) In item (18), a transparent member of wedge shape may be provided at the bottom face of the workpiece, and the exposure light may be incident on the workpiece through the wedge shaped member.

(22) In item (21), the wedge shaped member may have an apical angle a determined in accordance with a relation $\alpha$=90 deg.−$\theta$ where $\theta$ is a blazed angle.

(23) In item (4), the shape of the vertical portion of the diffractive optical element may be defined by use of the first mask having wall-like protrusions formed with a desired period, wherein the shape of the slant portion of the diffractive optical element may be defined by use of the second mask which comprises a resist pattern of desired shape, being provided between the protrusions of the first mask.

(24) In item (23), the protrusions of the first mask may be defined by the provision of wall-like protrusions of desired period formed by etching the workpiece to a desired depth.

(25) In item (23) or (24), the resist pattern, the protrusions and the workpiece may be etched simultaneously by which the shape based on the resist pattern and the protrusions is transferred such that a blazed shape of right triangle is defined on the workpiece.

(26) In item (4), the shape of the vertical portion of the diffractive optical element may be defined by use of the first mask provided by embedding an etching mask in a wall-like groove having a desired period, wherein the shape of the slant portion of the diffractive optical element may be defined by use of the second mask comprising a resist pattern of a desired shape being provided between the etching masks.

(27) In item (26), a protrusion of the first mask may be formed by etching the workpiece to a desired depth to produce the wall-like groove of desired period and thereafter by embedding the etching mask in the groove.

(28) In item (27), the resist pattern and the workpiece may be etched simultaneously to produce a slant portion of the blazed shape, having a right angle shape, wherein the etching mask may be subsequently removed whereby a shape based on the resist pattern and the etching mask is transferred, such that a blazed shape of right angle shape is formed on the workpiece.

(29) In items (23), (24), (26) and (27), the wall-like protrusion or the etching mask may have a width not greater than 150 nm.

(30) In item (28), a reflection film comprising a chromium film, an aluminum film and a quartz film may be formed on the substrate having a triangular blazed shape.

(31) A mold for production of a diffractive optical element, characterized in that the mold is manufactured in accordance with a method as recited in any one of items (1)–(30).

(32) A diffractive optical element characterized in that the diffractive optical element is manufactured in accordance with a method as recited in any one of items (1)–(30).

(33) An optical system characterized by including a diffractive optical element as recited in item (32).

(34) An optical instrument characterized by including an optical system as recited in item (33).

(35) An exposure apparatus characterized by including an optical system as recited in item (33).

(36) A device manufacturing method characterized by producing a device by use of an exposure apparatus as recited in item (35).

(37) A device characterized by being produced in accordance with a device manufacturing method as recited in item (36).

These and other objects, features and advantages of the present invention will become more apparent upon a consideration or the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Figure 12A:
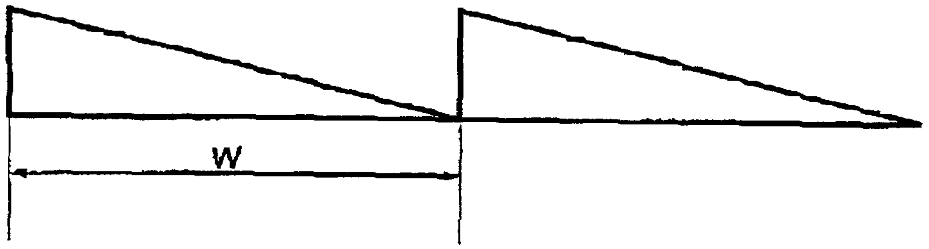
FIGS. 12A and 12B are schematic views for explaining an error in the blazed shape.
Figure 12B:
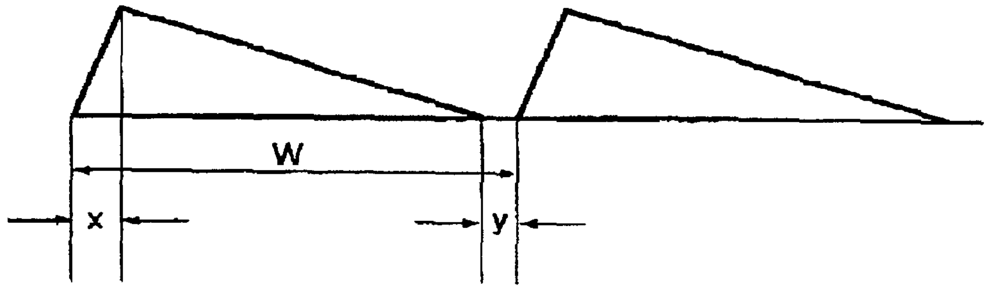
Figure 13A:
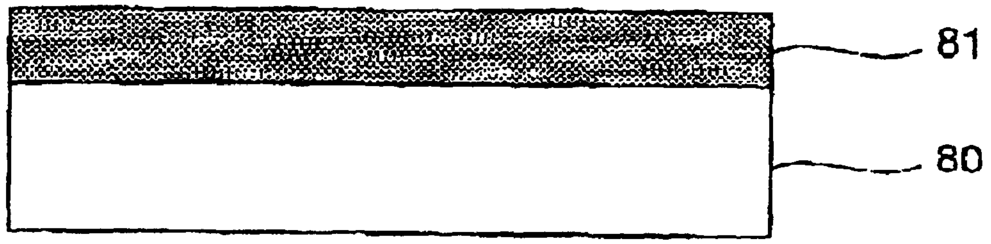
FIGS. 13A–13C are schematic views for explaining conventional manufacturing processes.
Figure 13B:
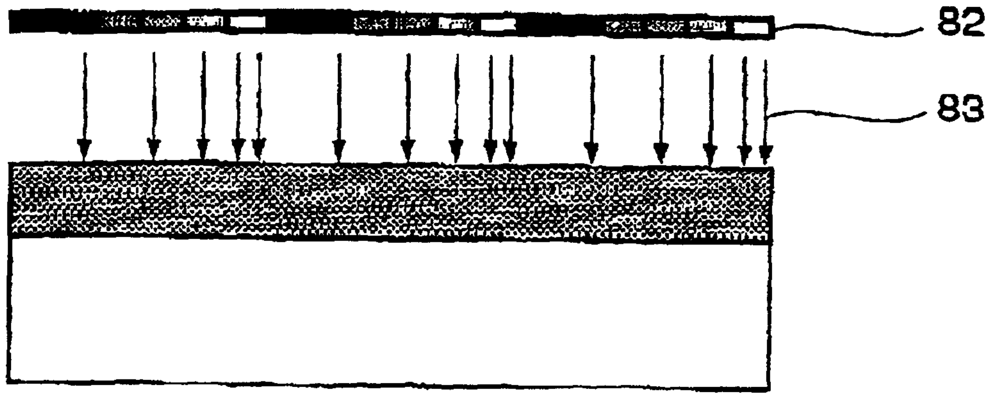
Figure 13C:
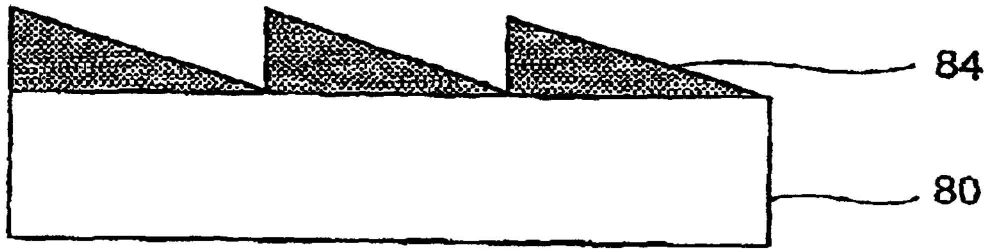
Figure 14:
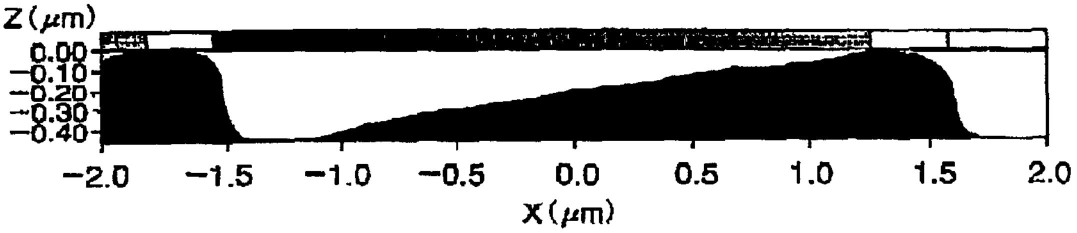
FIG. 14 is a schematic view for explaining difficulties in producing a blazed shape exactly.

In the preferred embodiments of the present invention to be described below, when a blazed diffraction grating, for example, is to be produced in accordance with the structure an described hereinbefore, the slant shape portion and the vertical shape portion of the blazed shape can be transferred to a workpiece satisfactorily by using masks as described above. More specifically, since the processing region is limited by use of the first mask, the vertical portion of the blazed shape is defined by transferring the edge of the first mask such that the verticalness can be retained. As a result, the shape of the blazed grating to be processed is not influenced by the verticalness of the resist pattern (x in FIG. 12B). Further, by registering the first and second masks with an accuracy of about the alignment error during the pattern exposure, any interruption of blazed shape (y in FIG. 12B) can be avoided.

A mask with which the vertical shape is to be transferred may be made by using the materials described above. Additionally, where they are formed with a self-registration function, the alignment error can be avoided and a good blazed grating can be produced. More specifically, by using two types of materials, processing regions can be defined alternately without an interspace and, therefore, a blazed shape can be produced without interruption.

Further, with the structure described above, a mask for transferring the shape of a blazed surface may be a resist, by which manufacture of a blazed grating with good shape controllability and good transfer property is assured.

Further, with the structure described above, the first mask may comprise a non-transparent material while the second mask may comprise a resist. The exposure light may be incident on the substrate, from behind thereof, thereby to control the shape of the second mask. By this, the end of the blazed face and the edge of the first mask which determines the vertical portion can be registered with each other. As a result, the pattern shape error (y in FIG. 12B) which causes decrease of the diffraction efficiency can be reduced.

Further, with the structure described above, when light is incident from behind the substrate, an anti-reflection mechanism may be provided on the resist surface by which any disturbance in shape of the second mask due to the reflection at the resist surface can be avoided.

Further, with the structure described above, when light is incident from behind the substrate, a wedge shaped member may be intimately contacted to the back face of the substrate. This enables shortening of the wavelength. As a result, even if the blaze angle becomes small, light can enter into the substrate at a desired angle without being blocked by total reflection.

Further, with the structure described above, a diffractive optical element having good optical performance, an optical system using such diffractive optical element, and a semiconductor exposure apparatus using such optical system can be provided.

Further, with the structure described above, wall-like protrusions may be formed at a position corresponding to the vertical portion of the diffraction pattern by etching the substrate to a predetermined depth and, subsequently, a resist pattern having a shape analogous the slant portion of the diffraction pattern may be formed between the protrusions. Alternatively, the substrate may be etched to a predetermined depth to produce a wall-like groove at a position corresponding to the vertical portion of the diffraction pattern. A film of a material such as metal or any other material having a selection ratio to the substrate in a subsequent etching process, may be formed on the substrate. By using an etch-back method or chemical and mechanical polishing (CMP) method, the groove may be filled to provide an etching mask. After this, a resist pattern having a shape analogous to the slant portion of the diffraction pattern may be formed between the etching masks. Thus, the vertical portion and the slant portion of the diffraction pattern are formed separately by means of the structure and the resist pattern, the error in shape to be produced when the diffraction pattern is produced only by using a resist pattern, is reduced. Particularly, the verticalness of the vertical portion becomes better.

Since the vertical portion and the slant portion of the diffraction pattern are formed separately by using a structure and a resist pattern, use of optical exposure technology is enabled. Therefore, a sufficiently high throughput is attainable in the production.

Specific examples of the present invention will be described below.

[Embodiment 1]

Figure 1A:
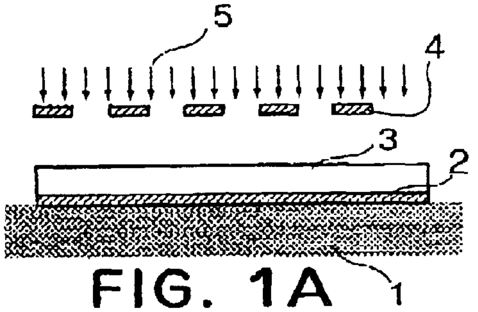
FIGS. 1A–1O are schematic and sectional views for explaining manufacturing processes in accordance with a first embodiment of the present invention.
Figure 1B:
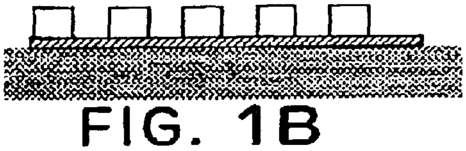
Figure 1C:
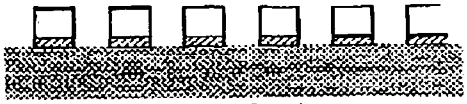
Figure 1D:
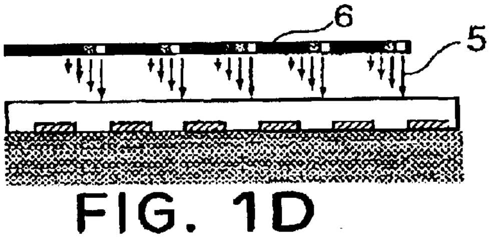
Figure 1E:
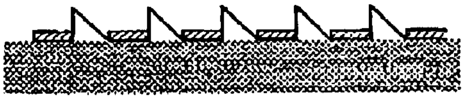
Figure 1F:
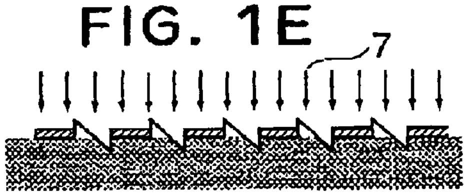
Figure 1G:
Figure 1H:
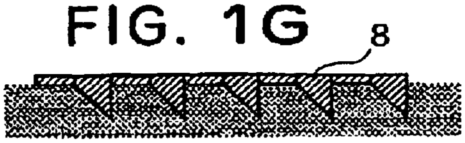
Figure 1I:
Figure 1J:
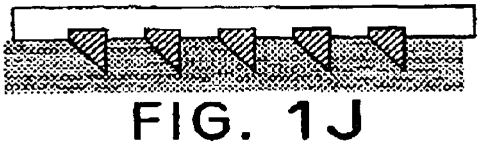
Figure 1K:
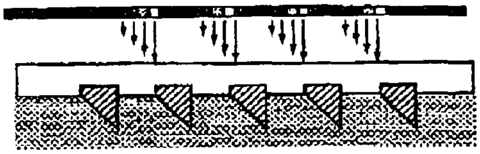
Figure 1L:
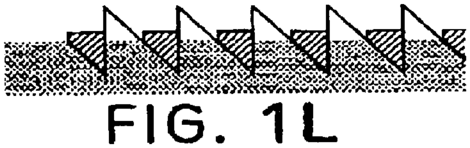
Figure 1M:
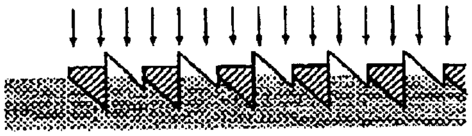
Figure 1N:
Figure 1O:

FIGS. 1A–1O are schematic and sectional views for explaining manufacturing processes according to a first embodiment of the present invention. In these drawings, denoted at 1 is a quartz substrate, and denoted at 2 is a chromium film. Denoted at 3 is a resist, and denoted at 4 is a mask. Denoted at 5 is exposure light, and denoted at 6 is a gray tone mask. Denoted at 7 is an ion beam, and denoted at 8 is an aluminum film.

Initially, as a first mask, a chromium film (first material) 2 is formed on the quartz substrate 1. Subsequently, a resist 3 is applied onto it. Then, a pattern of the mask 4 is transferred to the resist, by exposure with exposure light (FIG. 1A).

By using the resist pattern as a mask, the chromium film is etched (FIG. 1B).

After the chromium film 2 is etched, the resist is removed. Thus, by using an etching condition with which a sufficient selection ratio to the chromium film 2 can be kept for the etching of the quartz 1, a processing region is defined as an opening of the chromium film 2.

As regards the chromium film etching condition, use of CC14+CO2 as a gas is reported by Y. Suzuki, T. Yamazaki and H. Nakata, in Japanese Journal of Applied Physics, 21, 1328 (1982). After the resist is applied again, exposure is performed by using the gray tone mask 6. Here, the portion to be exposed by using the gray tone mask 6 is aligned with respect to the opening portion of the etched chromium film 4. Further, the edge of the portion where the exposure light amount changes is designed so that it minutely overlaps with the edge of the chromium film which remains on the quartz substrate 1, and it is thicker than the width of the opening of the chromium film 2. Since this width has been determined while taking into account the alignment error, as compared with the opening portion of the chromium film 2, it is thicker twice than the alignment error. In the drawings, the mask transmission factor is illustrated as if it changes stepwise. However, this is for the sake of ease in illustration. Practically, it can be controlled precisely, and the distribution of the light quantity is smooth.

In the positive type resist used here, the remaining film thickness changed in accordance with the light quantity. Therefore, a produced resist pattern has a blazed shape such as shown in FIG. 1E. This is the second mask, and the shape of the resist pattern (second mask) in transferred as a bottom shape as the opening portion of the first mask is etched. The resultant is then transferred to the quartz substrate 1, by using anisotropic dry etching to be done from the above (FIGS. 1F and 1G).

For convenience of explanation, the selection ratio of the resist and the quartz in the drawings is 1:1. This is variable with the etching condition. Depending on the blaze angle to be transferred, the selection ratio may be other than 1:1. For example, where the blaze angle is very small, the selection ratio maybe changed, rather than by thinning the resist in accordance with the blazed shape, to determine an etching condition with which the resist shape is reduced in the depth direction. This facilitates the operation.

Subsequently, by using an electron beam deposition method, an aluminum film 8 is formed as a second material, with a thickness of the extent that can cover the remaining chromium film 2. Then, by CMP (chemical mechanical polishing), the film 8 is polished until its surface level becomes coplanar with the surface of the remaining chromium film. This procedure is generally called a damascene process in semiconductor manufacturing processes. While CMP is used in this example, the surface levels of the chromium film 2 and the aluminum film 8 may be registered by an etch-back method. As a further alternative, a positive type resist may be applied and a resist pattern may be formed on the remaining chromium film 2 by projecting exposure light from behind the quartz substrate 1, and subsequently, an aluminum film 8 may be formed. After this, by using a lift-off method, the resist pattern may be removed together with the aluminum film formed thereon. When the chromium film 2 is removed after the aluminum film 8 is embedded in, the processing region is inversed. A portion not having been processed now becomes a processing portion (FIG. 1I)

As described, by forming the first mask by using two types of materials, the shape can be continuous and no error is produced. After the processing region is determined by the aluminum film 8, similar processes as the first mask is defined by use of the chromium film 2 are repeated, whereby a blazed shape is defined between the aluminum film 8 portions. Finally, the aluminum film 8 is removed, whereby a desired blazed grating is produced.

Further, while this embodiment uses a chromium film as the first material of the first mask, a chromium oxide film may be formed on the surface of the chromium film. This provides an anti-reflection effect in the lithoqraphic process. Experiments were made with used of the dual structure using a chromium oxide film and a chromium film, and good results were obtained in pattern formation.

In accordance with this method, the vertical portion of the etched shape is defined by the edge of the first mask, while the slant of the blazed grating is defined by the transferred shape of the second mask. Therefore, in the resist pattern formation using the second mask, only the gradient that determines the blazed shape should be regarded.

Here, for simplicity, a model of a grating having uniform pitch has been explained. However according to the method of this embodiment, the pitch can be designed arbitrarily. Also, the grating pattern can be designed even two-dimensionally.

[Embodiment 2]

In order to etch quartz by using silicon nitride as a mask, O2CF3Br may be used as an additive gas to CF4 gas, and the selection ratio may be increased thereby (F. H. M. Sanders, J. Dieleman, H. J. B. Peters, and J. A. M. Sanders, "J. Electrochem. Soc.", 129. 2559 (1982)).

Thus, in the second embodiment, silicon nitride is used in place of any one of chromium film and aluminum film for the first material of the first mask in the first embodiment or chromium oxide film and chromium film for the dual-layer film. With use of silicon nitride, good characteristics were obtained, and it was confirmed that the present invention can be embodied with this.

[Embodiment 3]

In the third embodiment of the present invention, an regards the first mask used in the first embodiment, one of chromium film, dual-layer film of chromium oxide film and chromium film, and alumina film is used as the first material, whereas a negative type resist is used as the second material. After the processing or a first opening portion is completed, the first opening portion is filled with a negative resist. After the negative resist is applied, exposure light is projected from behind the quartz substrate. Since any of the first materials have a light blocking property to exposure light, only the resist at the opening portion is sensitized (reacted) and thus it remains after the development. By hard-baking this, it has been confirmed that, where a resist is applied again and the lithographic process is to be carried out, there occurs no mixing of resist materials.

[Embodiment 4]

Figure 2A:
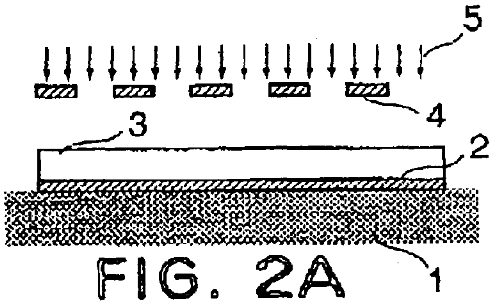
FIGS. 2A–2N are schematic and sectional views for explaining manufacturing processes in accordance with a fourth embodiment of the present invention.
Figure 2B:
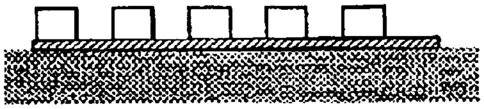
Figure 2C:
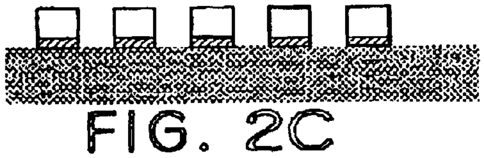
Figure 2D:
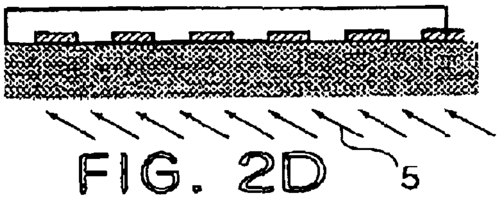
Figure 2E:
Figure 2F:
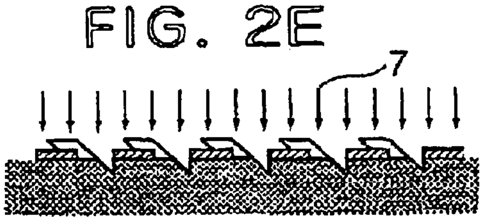
Figure 2G:
Figure 2H:
Figure 2I:
Figure 2J:
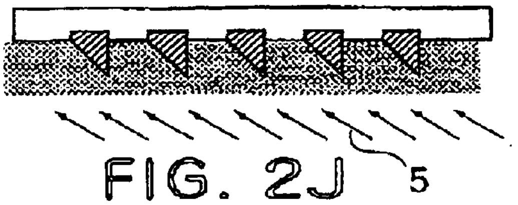
Figure 2K:
Figure 2L:
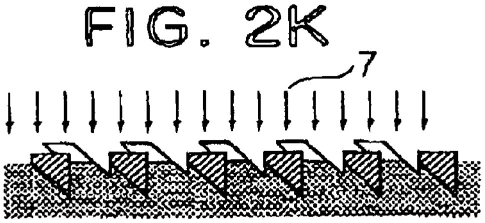
Figure 2M:
Figure 2N:

FIGS. 2A–2N show manufacturing processes according to a fourth embodiment of the present invention. In these drawings, like the first embodiment, a chromium film 2 is formed on a quartz substrate 1. A resist is then applied to the surface of the chromium film 2, and a pattern to be used as a first mask is photoprinted. While using the thus produced resist pattern as a mask, the chromium film 2 is etched, such that the chromium film 2 that determines the processing region is completed (FIG. 2C).

Subsequently, a negative resist is applied to the surface of the quart substrate 1, and exposure light is incident obliquely from behind the quartz substrate 1. In the negative resist, the exposed portion remains after development. Therefore, the pattern to be produced after the oblique exposure is a resist pattern being obliquely inclined such as shown in FIG. 2E.

The thus produced resist pattern functions as a second mask. The tilt of the side face of the resist pattern corresponds to the shape to be transferred to the etching bottom, as the shape of the second mask. Here, the magnification to be transferred in the depth direction is variable with the etching condition. Therefore, the resist pattern may be formed with an angle determined on the basis of a desired blazed angle while taking into account the selection ratio of the etching. Here, for simplicity, a case where the selection ratio is 1 is illustrated. FIG. 2G shows a state in which resist shape which is a second mask is transferred to the whole surface of the processing region which is determined by the chromium film 2. Here like the first embodiment, the aluminum film 8 is embedded in between remaining chromium film 2 portions by means of the CMP method or the like. After that, the chromium film 2 is removed. With this procedure, the processing region is inversed, without interspace.

Figure 3A:
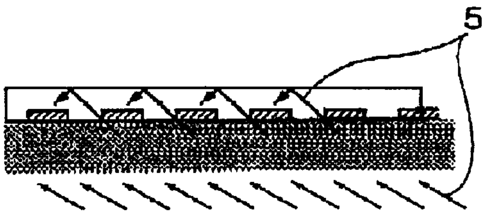
FIGS. 3A–3D are schematic and sectional views for explaining the fourth embodiment.
Figure 3C:
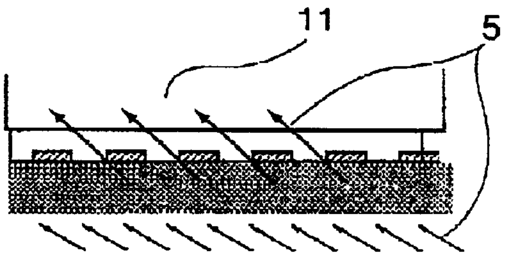
Figure 3B:
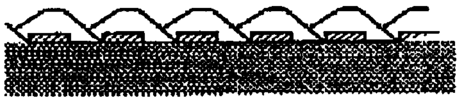
Figure 3D:

After the processing region is defined by the aluminum film 8, processes similar to those in the case where the first mask comprises a chromium film 2 are carried out, by which a blazed shape is produced between the aluminum film 8 portions. Finally, the aluminum film 8 is removed completely, such that a desired blazed grating is completed. Where the wavelength used for the blazed grating to be produced is short and the blaze angle becomes small, there may be cases wherein as shown in FIG. 3A the exposure light is reflected by the resist surface and therefore the resist shape is degraded (FIG. 3D). In such case as shown in FIG. 3C, a material having a refractive index similar to that of the resist may be intimately contacted to the resist surface, as an anti-reflection member 11, and the exposure process may be carried out. As regards the refractive index, as long as it is about ±10% of the resist refractive index, reflection at the interface can be effectively prevented to a substantial degree.

Figure 4A:
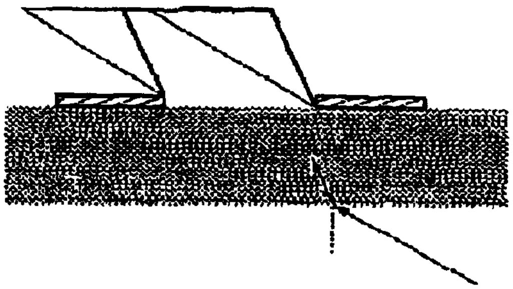
FIGS. 4A and 4B are schematic and sectional views for explaining the fourth embodiment.

Further, in this embodiment, the exposure light is incident from the bottom face the substrate. Therefore, the exposure light may be refracted at the bottom interface as shown in FIG. 4A, in accordance with the Snell's law. Since light enters into the medium from the atmosphere, the angle of light incident on the resist with respect to the surface of the quartz substrate 1, that is, the angle that determines the blaze angle, becomes large. Further, if the exposure light is projected in a direction excessively nearly parallel to the substrate surface while taking into account the refraction, due to total reflection a sufficient light quantity can not impinge on the resist.

Figure 4B:
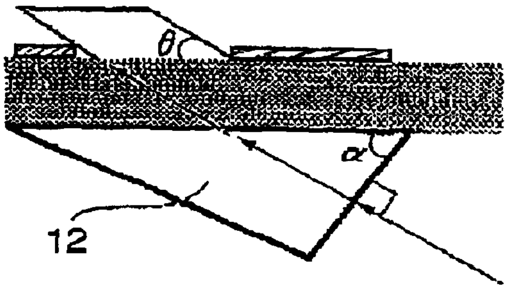
Figure 5:
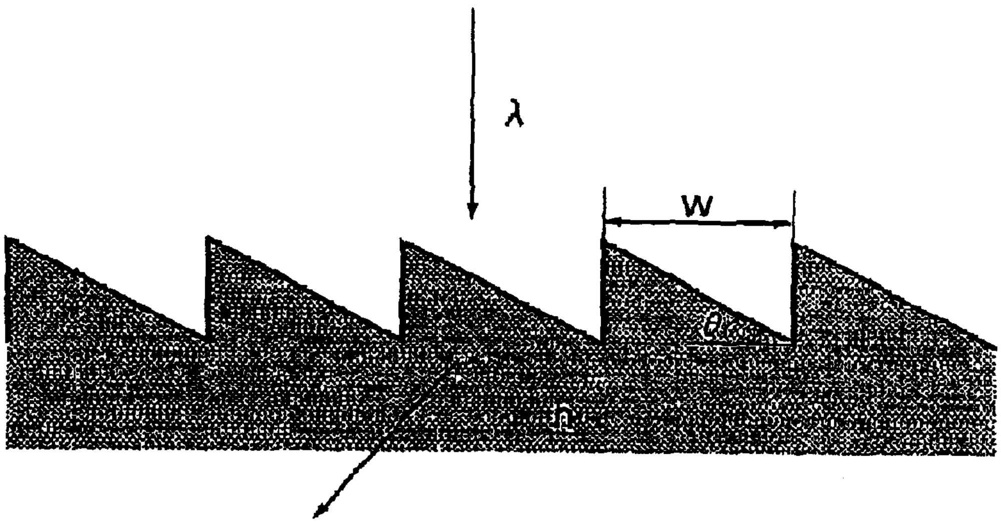
FIG. 5 is a schematic view for explaining a blaze condition.

In consideration of the above, if in this embodiment a small blaze angle is to be produced, as shown in FIG. 4B, a glass member of wedge shape 12 may be intimately brought into contact with the bottom face of the quartz substrate, such that the exposure light is incident through the wedge shaped member 12. The apical angle of the wedge shaped member may be set so that the surface becomes approximately perpendicular to the exposure light ray impinging thereon. The apical angle of the wedge can be determined easily, and it corresponds to the reminder of subtracting the blaze angle from 90 degrees.

[Embodiment 5]

FIGS. 6A–6F are schematic and sectional views for explaining manufacturing processes of right triangular blazed shape diffractive optical element, in which wall-like protrusions are formed at a desired period. In the first step shown in FIG. 6A, a positive resist 16 is applied onto a quartz substrate 10 and, after that, at the second stop shown in FIG. 6B, a stepper with exposure light of 248 nm wavelength as well as a phase shift reticle are used to produce a resist pattern 17 of a width 100 nm, at a desired position corresponding to the vertical portion of a diffraction pattern of blazed shape, comprising a right triangular shape.

Figure 6A:
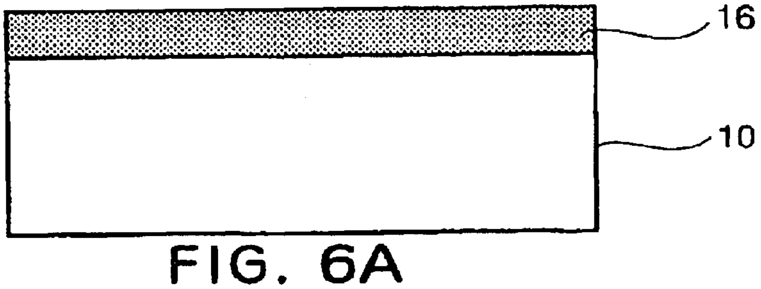
FIGS. 6A–6F are schematic views for explaining manufacturing processes in accordance with a fifth embodiment of the present invention.
Figure 6B:
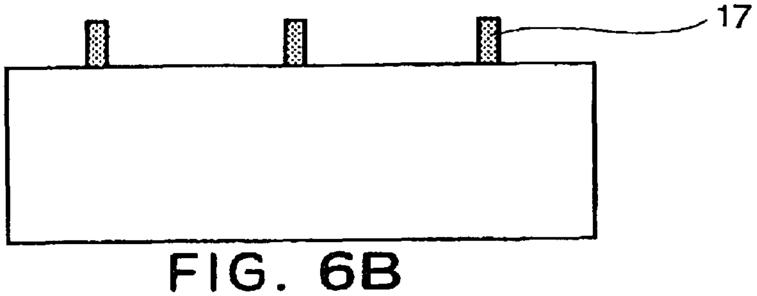
Figure 6C:
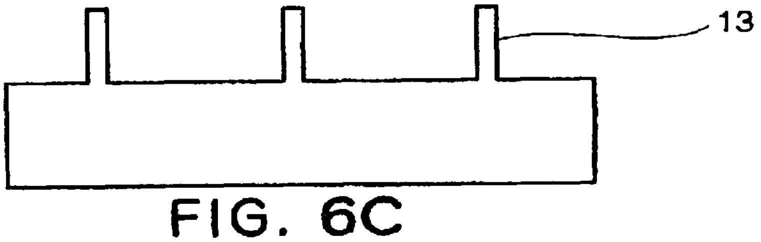
Figure 6D:
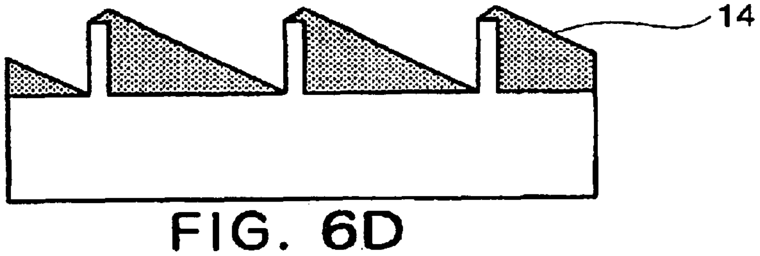

In the third step shown in FIG. 6C, in accordance with reactive ion etching method (RIE method) and under the condition that a CHF3 gas at a flow rate of 12.6 sccm, an RF power of 200 W, and a pressure of 4 Pa, the quartz substrate 10 is etched to a depth 427 nm, whereby protrusions 13 are produced. Subsequently, a positive resist is applied onto the quartz substrate 10 to a thickness 427 nm and, after that, in the fourth step shown in FIG. 6D, by using a stepper with exposure light of 248 nm wavelength and a transmission factor controlling reticle, a resist pattern 14 having the same angle as the slant portion of the blazed shape diffraction pattern, having a right triangular shape, is formed between protrusions 13.

In the procedure described above, with the protrusions 13 and the resist patterns 14, a structure having the same shape as of the diffraction pattern to be produced, except for the difference due to the width of the protrusion 13, is produced on the substrate 10.

Further, the angle of the side wall of the protrusion which is produced by the anisotropic RIE method can be defined at about 88 deg., under the above-described condition, and the above-described shape error amount x can be estimated approximately as not greater than 20 nm. Further, the exposure amount for the resist patterning in this process is set slightly smaller than the ordinary level. With this procedure, the resist shape error at the slant portion (FIG. 12B) can be reduced.

Figure 6E:
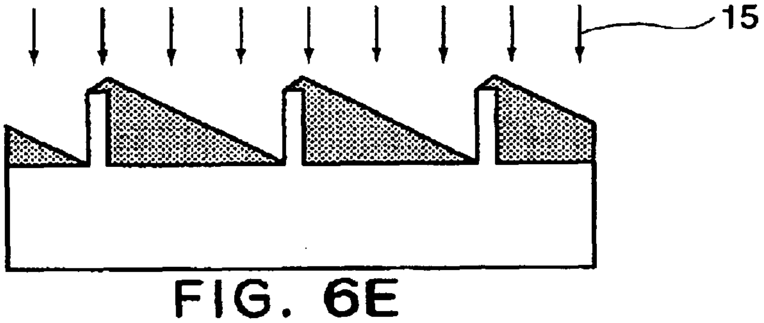
Figure 6F:
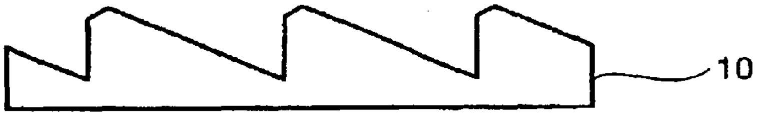

Subsequently, at the fifth step in FIG. 6E, in accordance with reactive ion etching method (RIE method) and under the condition that a mixture gas of CF4 and oxygen at respective flow rates of 21 sccm and 3 sccm, an RF power of 90 W, and a pressure of 4 Pa, the protrusions 13 and the resist patterns 14 are etched simultaneously until they are removed. By this procedure, a diffractive optical element of blazed shape, having a right triangular sectional shape, such as shown in FIG. 6F, is accomplished.

Here, the RIE etching condition used in the fifth step (FIG. 6E) is adjusted go to at the selection ratio of the quartz (substrate material) and the resist becomes equal to 1.0, and the shape comprising the protrusion 13 and the resist pattern 14 determined at the fourth step (FIG. 6D) is directly transferred to the substrate 10.

The thus produced diffractive optical element having a smallest period 2.80 microns and a depth 427 nm can be an embodiment of an irregular period diffractive optical element having a high-precision right triangular shape blazed structure, including only a very small shape error with respect to an idealistic shape.

[Embodiment 6]

FIGS. 7A–7E are schematic and sectional views for explaining manufacturing processes of a blazed diffractive optical element having a right triangular shape, according to a sixth embodiment, in which wall-like grooves are formed at a desired period. In the first step of FIG. 7A, a resist pattern 21 having opening portions of a width 150 nm formed at positions corresponding to vertical portions of a desired diffraction pattern, is formed on a quartz substrate 20. After this, at the second step shown in FIG. 7B, in accordance with reactive ion etching method (RIE method) and by use of a mixture gas of CHF3 and oxygen, the quartz substrate 20 is etched to a depth 427 nm, whereby wall-like grooves 22 are produced. Subsequently, by using a sputtering method, an Al film is formed on the quartz substrate 20 to a thickness 500–1000 nm, so that the grooves 22 are filled thereby. After this, at the third step of FIG. 7C, by using a chemical mechanical polishing method (CMP), the Al film is removed until the surface of the quartz substrate 20 is exposed, by which a wall-like etching mask 23 is produced. With the procedure described above, the vertical portions of a desired right triangular diffraction pattern are formed.

Figure 7A:
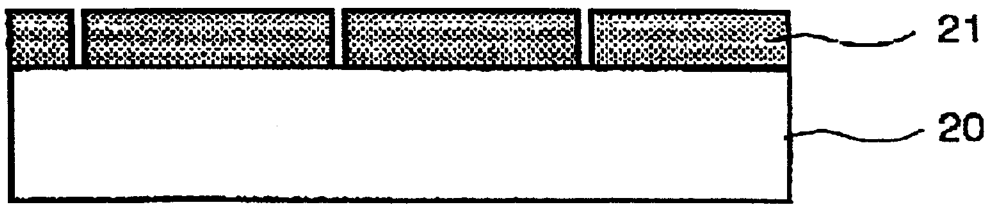
FIGS. 7A–7E are schematic views for explaining manufacturing processes in accordance with a sixth embodiment of the present invention.
Figure 7B:
Figure 7C:
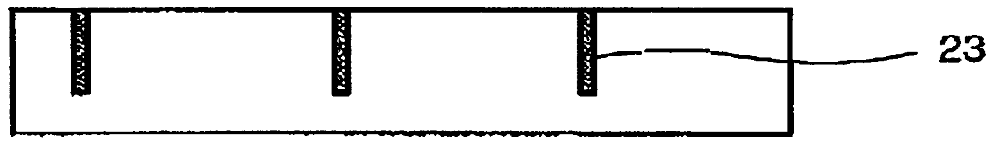
Figure 7D:
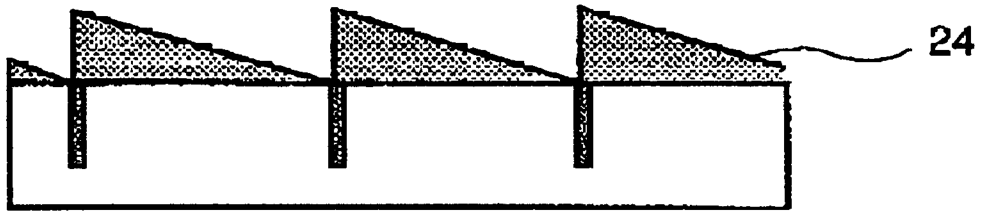

Subsequently, a positive resist is applied onto the substrate 20 to a thickness 400–500 nm, and after that, in the fourth step of FIG. 7D, by using a stepper with exposure light of 248 nm wavelength and a transmission factor controlling reticle, a resist pattern 24 having the same angle as the slant portion of the blazed shape diffraction pattern, having a right-triangular shape, is formed between the etching mask portions 23. With the procedure described in the foregoing, a structure of the same shape as of a diffraction pattern to be produced, except for the difference due to the width of the groove 23, is produced on the substrate 10, wherein the vertical portion and the slant portion are formed separately and wherein the vertical portion of the desired diffraction pattern is defined by the groove while the slant portion is defined by the resist pattern 24.

Figure 7E:
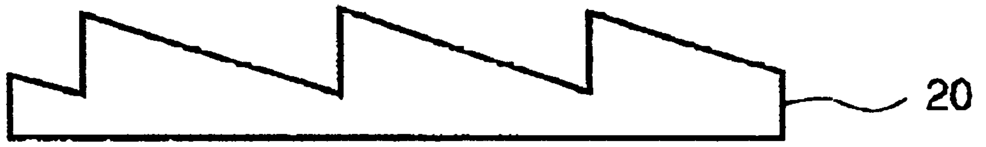

Subsequently, in accordance with reactive ion etching method (RIE method) and under the condition that a mixture gas of CF4 and oxygen at respective flow rates of 21 sccm and 3 sccm, an RF power of 90 W, and a pressure of 4 Pa, the resist is etched until the resist pattern 24 is removed. After this, the Al etching masks 23 is removed by using an etching liquid which consists of mixture solvent of phosphoric acid, nitric acid and acetic acid, whereby a blazed shape diffractive optical element having a right triangular sectional shape such as shown in FIG. 7E is accomplished. Here, the RIE etching condition used in the fourth and fifth steps (FIGS. 7E and 7E) in so adjusted that the selection ratio of the quartz (substrate material) and the resist becomes equal to 1.0 while the selection ratio of quarts and Al becomes largest as much as possible. The groove 22 having been determined at the second step (FIG. 7B) and the shape of the resist pattern 24 are combined and the combined is transferred to the substrate 10.

The thus produced diffractive optical element having a smallest period 2.80 microns and a depth 427 nm can be an embodiment of an irregular period diffractive optical element having a high-precision right triangular shape blazed structure, including only a very small shape error with respect to an idealistic shape.

In the fifth and sixth embodiments, the wall-like protrusion and the groove have a height 100 nm and a depth 150 nm. However, as regards the exposure technology to be used for the resist pattern formation for forming the protrusions or grooves, from the standpoint of further increases of precision required, use of exposure technology that enables formation of an extremely fine pattern is preferable. Therefore, the exposure light is not limited to ultraviolet light or deep ultraviolet light, but an electron beam or X rays or any other exposure technology may be used.

Further, in the fifth and sixth embodiment, as regards the etching method and condition for etching the substrate to produce wall-like protrusions or grooves, appropriate one with which the shape after the etching becomes rectangular may be chosen. Further, as regards the etching method and condition for etching the resist to form the slant portion, the etching selection ratio of the resist to the substrate may preferably be in a range of 0.5–5.0.

As a matter of course, an appropriate condition may be chosen in accordance with the combination of the selection ratio, the resist thickness and the desired depth.

In the fifth and sixth embodiments, the transmission factor control type mask used for exposure of the resist pattern, formation of the slant portion, is able to control the transmission factor to the exposure light, by, for example, changing the thickness of a metal (usually, chromium film) of the light blocking portion, or in accordance with a method in which opening portions and light blocking portions of fine lines or dots, which are unresolvable by the exposure proceed used, are provided and the width of them is changed.

Further, in the fifth and sixth embodiment, for exposure of the resist pattern for formation of the slant portion and the groove or protrusion, an alignment operation is necessary. Although an alignment error may occur in this procedure, with the exposure technology currently available, alignment precision of 100 nm or less and even a precision or 50 nm or less is attainable. Thus, such positional error can be absorbed by the width of the protrusion or groove. Therefore, it does not cause a shape error.

In the fifth and sixth embodiments, the substrate is not limited to a light transmission type. A reflection type substrate or an appropriate material may be chosen in accordance with the purpose of use of the mold.

Further, as regards the method of forming the etching mask material film, any one of vacuum deposition method, sputtering method, ion beam sputtering method, ion plating method, CVD method, electron beam method and so on, may be used.

Further, at opposite sides of the substrate of the diffractive optical element manufactured in accordance with the fifth or sixth embodiment, anti-reflection film may be provided as required.

[Embodiment 7]

Figure 8:
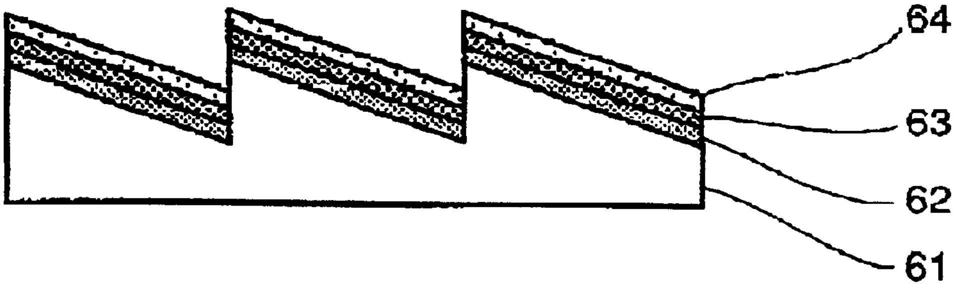
FIG. 8 is a schematic and sectional view of a reflection type diffractive optical element according to a seventh embodiment of the present invention.

FIG. 8 is a schematic and sectional view of a reflection type diffractive optical element according to a seventh embodiment of the present invention. A substrate 61 has a structure of right triangular shaped blazed shape, having been produced in accordance with the fifth or sixth embodiment. By using electron beam deposition method or the like, a chromium layer 62, an aluminum layer 63 and a quartz layer 64 are accumulated on the substrate 61, as an anti-reflection film. The chromium layer 62 has a property for enhancing intimateness of contact to the substrate 61, and the aluminum layer 63 functions as an anti-reflection layer. The quartz layer 63 has a function of protecting film. An regards the material of the substrate, silicon or quartz is usable. As regards the material of the anti-reflection film layer as well as the layered structure thereof, those with which each layers can exhibit their functions best, in relation to the wavelength used and the environment are selected. With the procedure described above, a reflection type irregular-period diffractive optical element having a high-precision right triangular shape blazed structure, including only a very small shape error with respect to an idealistic shape, in accomplished.

[Embodiment 8]

Figure 9:
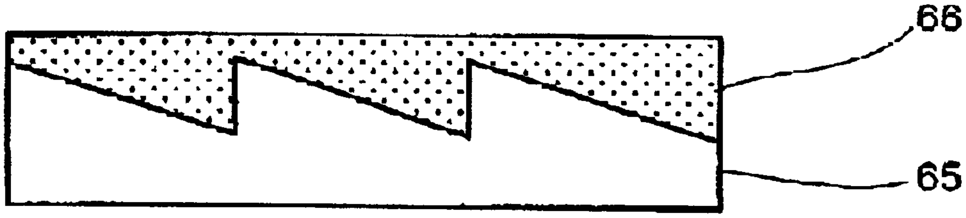
FIG. 9 is a schematic and sectional view of a diffractive optical element according to an eighth embodiment of the present invention.

FIG. 9 is a sectional view of a diffractive optical element according to an eighth embodiment. A substrate 65 has a structure with a right triangular blazed shape, having been produced in accordance with the fifth or sixth embodiment. The substrate 65 is used as a mold, and in accordance with a reproduction method such as an injection method or a 2P (Photo-Polymer) method, using photo-setting resin or the like, a diffractive optical element 66 is produced as a replica. In this manner, an irregular period diffractive optical element having a high-precision right triangular shape blazed structure, including only a very small shape error with respect to an idealistic shape, can be accomplished.

[Embodiment 9]

Figure 10:
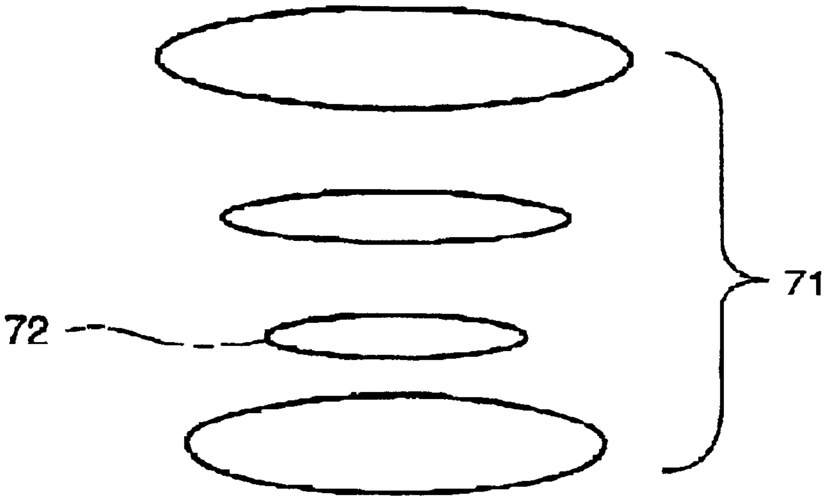
FIG. 10 is a schematic view of a projection optical system according to a ninth embodiment of the present invention.

FIG. 10 is a schematic view of a projection optical system having a diffractive optical element according to a ninth embodiment. An ordinary lens group 71 having spherical or aspherical surfaces includes a diffractive optical element 72 according to this embodiment. The surfaces of the ordinary lens group 71 are coated with an anti reflection film.

The diffractive optical element 72 cooperates with the ordinary lens system 71 to correct various aberrations of the optical system, such as chromatic aberration or Seidel's five aberrations, for example. Such a projection optical system may be used in various cameras, an interchanging lens system for a single reflex camera, office machines such as copying machines, projection exposure apparatuses for production of liquid crystal panels, and projection exposure apparatuses for production of semiconductor chips such as IC or LSI, for example.

[Embodiment 10]

Figure 11:
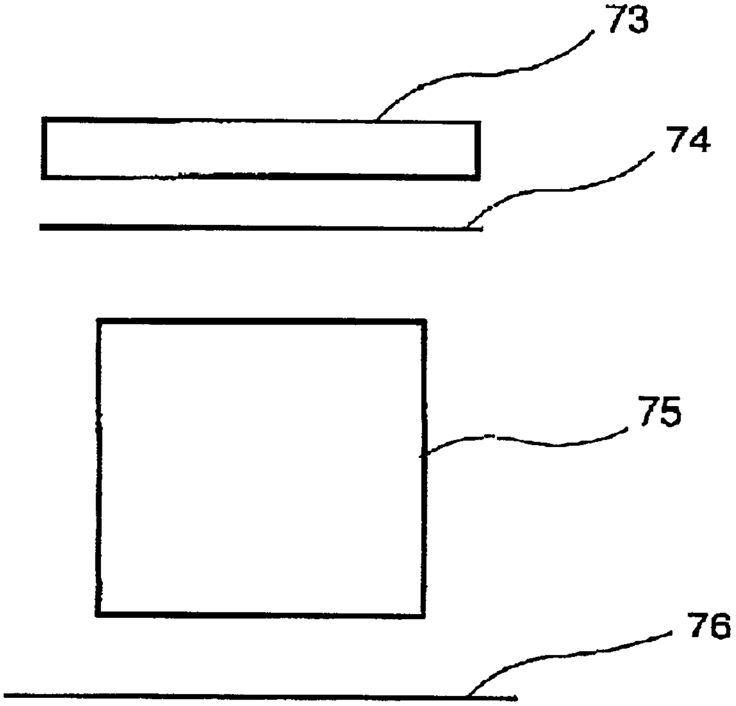
FIG. 11 is a schematic view of a projection exposure apparatus according to a tenth embodiment of the present invention.

FIG. 11 is a schematic view of a projection exposure apparatus according to a tenth embodiment. In FIG. 11, the projection exposure apparatus includes an illumination optical system 73 for supplying exposure light, a mask 74 to be illuminated by the illumination optical system 73, a projection optical system 75 for projecting an image of a device pattern formed on the mask 74, and a glass substrate or silicon substrate having a resist applied thereto.

The illumination optical system 73 and/or the projection optical system 75 includes a diffractive optical element according to this embodiment. The lens surfaces of the illumination optical system 73 or the projection optical system 75 have anti-reflection films formed thereon. The exposure light from the illumination optical system 73 illuminates the mask 74, and the image of the device pattern formed on the mask 74 is projected on the glass or silicon substrate 76.

In accordance with the embodiments of the present invention as described above a high precision diffractive optical element can be produced in accordance with conventional lithographic processes, yet the production throughput can be improved and, simultaneously therewith, the shape precision can be assured.

Further, in the formation of the blazed shape according to the lithographic process, errors such as tilt of the vertical portion and interruption of the blazed surface at the vertical portion, can be avoided.

Further, a diffractive optical element of blazed shape can be produced easily, and a high precision diffractive optical element having a large freedom or latitude can be manufactured at a high productivity.

While the invention has been described with reference to the structures disclosed herein, it is not confined to the details set forth and this application is intended to cover such modifications or changes as may come within the purposes of the improvements or the scope of the following claims.

What is claimed is:

1. A method of manufacturing a diffractive optical element by transferring a mask pattern to a workpiece comprising the steps of:

defining a shape of a vertical portion of the diffractive optical element by use of a first mask; and defining a shape of a slant portion of the diffractive optical element by transferring a shape of a surface of a second mask in a processing region determined by the first mask, wherein the surface of the second mask is tilted obliquely, wherein the shape of the slant portion of the diffractive optical element is determined by the transferred shape of the surface of the second mask, wherein the first mask is made of first and second materials, wherein, after a first processing region determined by the first material is processed, the first processing region is covered by the second material and, subsequently, the first material is removed, and wherein while using a portion from which the first material has been removed as a second processing region, the first processing region determined by the first material is replaced by the second material to cause a processing region inversion.

2. A method according to claim 1, wherein each of the first and second materials consists of at least one of metal, oxide and nitride.

3. A method according to claim 2, wherein one of the first and second materials comprises a chromium oxide film, and the other comprises an aluminum film.

4. A method according to claim 3, wherein said first and second materials comprise silicon nitride.

5. A method according to claim 2, wherein one of the first and second materials comprises a dual-layer film having a chromium oxide film and a chromium film, and wherein the other material comprises an aluminum film.

6. A method according to claim 1, wherein the inversion of processing region is based on one of etch-back method, lift-off method, damascene method, and selective deposition method.

7. A method according to claim 1, wherein the first mask is made of first and second materials, wherein the first material comprises a light blocking material and the second material comprises a negative resist, wherein light is transmitted through the workpiece made of a light transmitting material, from behind thereof, thereby to cause reaction of the negative resist, wherein a processing region determined by the first material is covered by a negative resist and, thereafter, hard baking is carried out, and wherein the first material is removed to cause inversion of processing region.

8. A method according to claim 7, wherein the first material of the first mask comprises a metal film.

9. A method according to claim 8, wherein the metal film is one of a chromium film and an aluminum film.

* * * * *

UNITED STATES PATENT AND TRADEMARK OFFICE

CERTIFICATE OF CORRECTION

PATENT NO. : 6,930,834 B2 
DATED : August 16, 2005
INVENTOR(S) : Makoto Ogusu et al.

It is certified that error appears in the above-identified patent and that said Letters Patent is hereby corrected as shown below:

Column 1,
Line 29, "in" should read -- is --; and
Line 52, "there occurs no error" should read -- no error occurs --.

Column 2,
Line 7, "in dependence" should read -- depending --;
Line 20, "can not" should read -- cannot --;
Line 27, "in" should read -- is --; and
Line 62, "of" should be deleted.

Column 3,
Lines 12 and 17, "in" should read -- is --;
Lines 21 and 29, "an" should read -- as --;
Line 57, "error" should read -- errors --; and
Line 66, "amount x and y changes" should read -- amounts x and y change --.

Column 4,
Line 15, "shapes," should read -- shape, --;
Line 21, "Is" should read -- is --;
Line 46, "and for the blazed shape in" should read -- so that the blazed shape is --; and
Line 49, "produce" should read -- produced --.

Column 5,
Line 8, "in" should read -- In --;
Line 10, "ferred" should read -- ferring --; and
Line 30, "film" should read -- film. --.

Column 7,
Line 58, "an" should read -- as --.

Column 9,
Line 28, "CCl4+CO2" should read -- $CCl_4+CO_2$ --;
Line 50, "in" should read -- is --; and
Line 60, "maybe" should read -- may be --.

Column 10,
Line 29, "lithoqraphic" should read -- lithographic --;
Line 30, "used" should read -- use --; and
Line 46, "O2CF3Br" should read -- $O_2CF_3Br$ --, "CF4" should read -- $CF_4$ --; and
Line 58, "an" should read -- as --.

UNITED STATES PATENT AND TRADEMARK OFFICE

CERTIFICATE OF CORRECTION

PATENT NO. : 6,930,834 B2 
DATED : August 16, 2005
INVENTOR(S) : Makoto Ogusu et al.

It is certified that error appears in the above-identified patent and that said Letters Patent is hereby corrected as shown below:

Column 11,
Line 66, "can not" should read -- cannot --.

Column 12,
Line 26, "CHF3" should read -- $CHF_3$ --;
Line 39, "as" should read -- as that --; and
Line 53, "CF4" should read -- $CF_4$ --.

Column 13,
Line 16, "CHF3" should read -- $CHF_3$ --;
Line 35, "as" should read -- as that --;
Line 44, "CF4" should read -- $CF_4$ --;
Line 53, "in" should read -- is --; and
Line 55, "quarts" should read -- quartz --.

Column 14,
Lines 9 and 30, "embodiment," should read -- embodiments, --;
Line 28, "proceed" should read -- process --;
Line 64, "An" should read -- As --; and
Line 67, "with" should read -- in --.

Column 15,
Line 1, "layers" should read -- layer --; and "their" should read -- its --;
Line 2, "environment" should read -- environment, --;
Line 7, "in" should read -- is --; and
Line 27, "anti reflection" should read -- anti-reflection --.

Signed and Sealed this

Twenty-first Day of February, 2006

JON W. DUDAS
*Director of the United States Patent and Trademark Office*